United States Patent
Roy

(10) Patent No.: US 10,193,009 B1
(45) Date of Patent: Jan. 29, 2019

(54) SINGLE PHOTON AVALANCHE GATE SENSOR DEVICE

(71) Applicant: STMicroelectronics (Crolles 2) SAS, Crolles (FR)

(72) Inventor: Francois Roy, Seyssins (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 15/945,972

(22) Filed: Apr. 5, 2018

(51) Int. Cl.
  *H01L 31/113* (2006.01)
  *H01L 31/0224* (2006.01)
  *H01L 27/146* (2006.01)

(52) U.S. Cl.
  CPC ...... *H01L 31/1136* (2013.01); *H01L 27/1463* (2013.01); *H01L 27/14605* (2013.01); *H01L 27/14614* (2013.01); *H01L 27/14643* (2013.01); *H01L 31/022408* (2013.01); *H01L 31/022475* (2013.01); *H01L 27/1464* (2013.01)

(58) Field of Classification Search
  CPC ........... H01L 31/1136; H01L 27/14605; H01L 27/14614; H01L 27/1463; H01L 27/14643; H01L 31/022408
  See application file for complete search history.

(56) References Cited

U.S. PATENT DOCUMENTS

| | | | | |
|---|---|---|---|---|
| 4,377,817 A | * | 3/1983 | Nishizawa | ........ H01L 27/14679 257/258 |
| 5,233,265 A | * | 8/1993 | Takasaki | ............... H01J 29/456 257/E31.049 |
| 2011/0187909 A1 | * | 8/2011 | Zhu | ........................ H01L 21/822 348/308 |
| 2016/0005894 A1 | * | 1/2016 | Zhang | ................... B82Y 40/00 257/29 |
| 2017/0219720 A1 | * | 8/2017 | Cortesi | ................... G01T 1/205 |
| 2018/0197905 A1 | * | 7/2018 | Sakata | ................... H01L 31/00 |

* cited by examiner

Primary Examiner — Walter H Swanson
(74) Attorney, Agent, or Firm — Crowe & Dunlevy

(57) ABSTRACT

A semiconductor substrate doped with a first doping type is positioned adjacent an insulated gate electrode that is biased by a gate voltage. A first region within the semiconductor substrate is doped with the first doping type and biased with a bias voltage. A second region within the semiconductor substrate is doped with a second doping type that is opposite the first doping type. Voltage application produces an electrostatic field within the semiconductor substrate causing the formation of a fully depleted region within the semiconductor substrate. The fully depleted region responds to absorption of a photon with an avalanche multiplication that produces charges that are collected at the first and second regions.

23 Claims, 11 Drawing Sheets

SINGLE PHOTON AVALANCHE GATE SENSOR DEVICE

TECHNICAL FIELD

The present disclosure relates to image sensors of either the front side illumination (FSI) type or back side illumination (BSI) type implemented with a junctionless photosensor.

BACKGROUND

Silicon avalanche diodes for image sensing are well known in the art. A junction between P conductivity type semiconductor material and N conductivity type semiconductor material is formed in a substrate. That PN junction is reversed biased with a relatively high voltage exceeding the breakdown voltage of the diode. Reception of a photon in the depletion layer triggers produces a self-sustaining avalanche and the generation of a detection current. Drawbacks of such devices include: an undesirably high dark current rate due to junction defects and implanted silicon defects and an undesirably high operating voltage (for example, in excess of 17 Volts).

There is a need in the art to address the foregoing problems.

SUMMARY

In an embodiment, a photosensor comprises: a semiconductor substrate doped with a first doping type; an insulated gate electrode adjacent said semiconductor substrate; a first region within the semiconductor substrate doped with the first doping type, wherein the first region is configured to be biased with a first bias voltage; and a second region within the semiconductor substrate doped with a second doping type that is opposite the first doping type, wherein the second region is configured to be biased with a second bias voltage. The insulated gate electrode is configured to be biased by a gate voltage to produce an electrostatic field within the semiconductor substrate causing the formation of a fully depleted region within the semiconductor substrate. The fully depleted region responds to absorption of a photon with an avalanche multiplication that produces charges that are collected at the first and second regions.

BRIEF DESCRIPTION OF THE DRAWINGS

The foregoing and other features and advantages will be discussed in detail in the following non-limiting description of specific embodiments in connection with the following illustrations wherein.

DETAILED DESCRIPTION

Figure 1A:
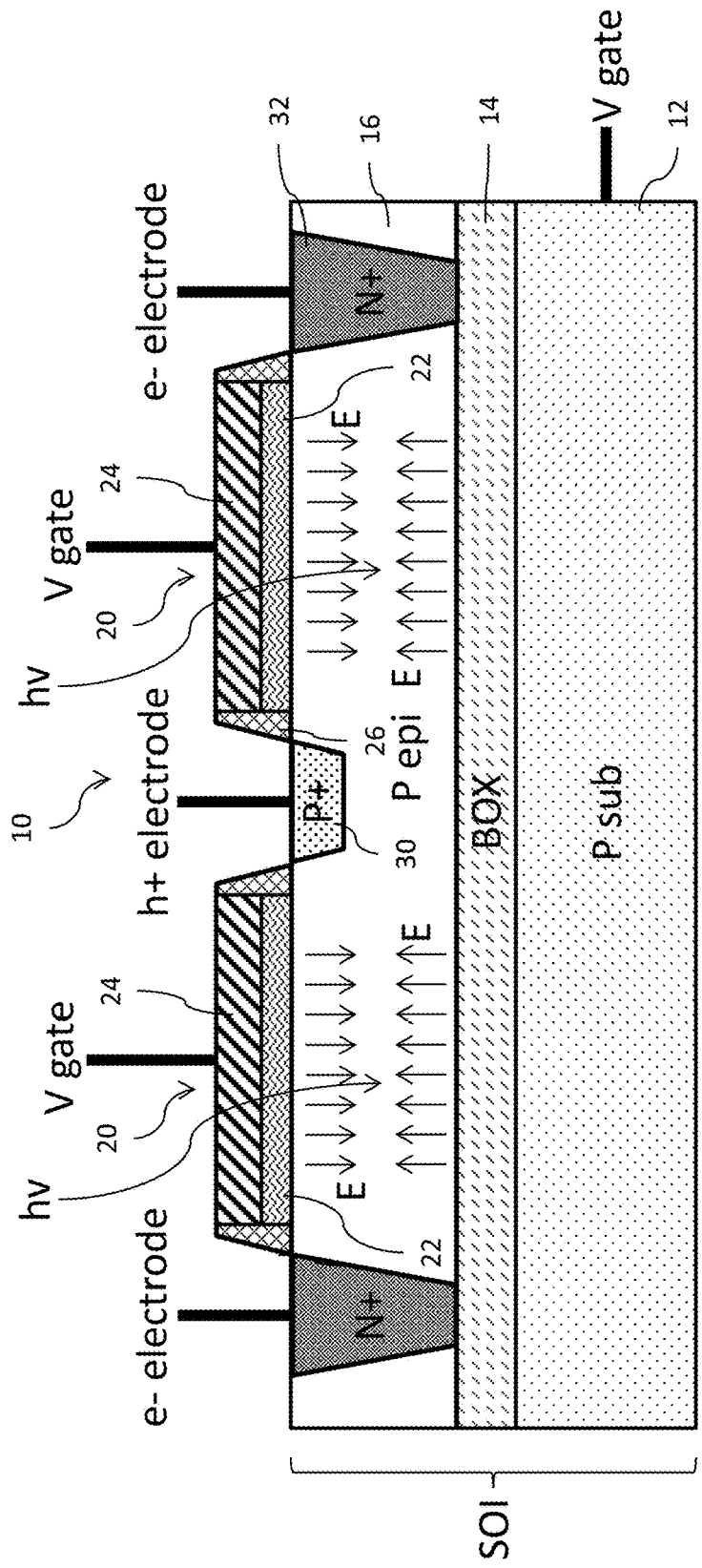
FIGS. 1A and 1B are cross-sectional diagrams of a front side illuminated single photon avalanche gate photosensor with a planar gate structure.

The same elements have been designated with the same reference numerals in the various drawings and, further, the various drawings are not to scale. For clarity, only those elements which are useful to the understanding of the described embodiments have been shown and are detailed. In particular, certain masks used during the steps of the manufacturing method described hereafter have not been shown.

In the following description, terms "high", "side", "lateral", "top", "above", "under", "on", "upper", and "lower" refer to the orientation of the concerned elements in the corresponding drawings.

Reference is now made to FIG. 1A wherein there is shown a cross-sectional diagram of a front side illuminated single photon avalanche gate (SPAG) photosensor device 10. The device 10 is formed on a silicon on insulator (SOI) substrate comprising a supporting semiconductor substrate 12, a buried insulating layer 14, also known to those skilled in the art as a buried oxide (BOX) layer, on top of the substrate 12, and a semiconductor film layer 16 on top of the buried insulating layer 14. The supporting semiconductor substrate 12 is lightly doped with a p-type dopant. The semiconductor film layer 16 is an epitaxially grown layer that is also doped with the p-type dopant. The dopant concentration in the supporting semiconductor substrate 12 may, for example, be in the range of $5\times10^{16}$ to $2\times10^{19}$ at/cm$^3$ and the dopant concentration in the semiconductor film layer 16 may, for example, be in the range of $1\times10^{16}$ to $5\times10^{17}$ at/cm$^3$.

A planar insulated gate structure 20 is formed on the front surface of the semiconductor film layer 16. In an implementation, the semiconductor film layer 16 may include a gradient doping of $1\times10^{14}$ at the middle of layer 16 up to $5\times10^{17}$ at/cm$^3$ at the top of the layer 16 adjacent the interface between the layer 16 and the gate structure 20. The planar insulated gate structure 20 includes a gate dielectric layer 22, a conductive gate 24 and sidewall spacers 26. The gate dielectric layer 22 may, for example, be made of a silicon oxide material as is conventional in the fabrication of MOSFET devices. The conductive gate 24 may, for example, be made of a polysilicon and/or metal material as is conventional in the fabrication of MOSFET devices. The sidewall spacers 26 may, for example, be made of silicon oxide and/or silicon nitride materials as is conventional in the fabrication of MOSFET devices.

The planar insulated gate structure 20 may have a ring shape in plan view, where the ring surrounds a first doped region 30 that is formed in the semiconductor film layer 16 at the front surface. The first doped region 30 is heavily doped with the p-type dopant. The dopant concentration in the first doped region 30 may, for example, be in the range of $5\times10^{18}$ to $5\times10^{20}$ at/cm$^3$. The first doped region 30 has a thickness which is less than a thickness of the layer 16. On the opposite side of the ring-shaped planar insulated gate structure 20, and in a position surrounding the planar insulated gate structure 20, a ring-shaped second doped region 32 is formed in the semiconductor film layer 16 at the front surface. The second doped region 32 is heavily doped with an n-type dopant and is separated from the first doped region 30 by a part of the substrate 12 located under the ring-shaped planar insulated gate structure 20. The dopant concentration in the second doped region 32 may, for example, be in the range of $5\times10^{18}$ to $5\times10^{20}$ at/cm$^3$. The second doped region 32 has a thickness which extends completely through the thickness of the layer 16 to reach the interface with the buried oxide layer 14.

Operation of the front side illuminated single photon avalanche gate photosensor device 10 to detect a photon (hv) entering the front surface requires respectively biasing the first doped region 30 through an h+ electrode, the second doped region 32 through the e− electrode, and finally the gate electrode 24. The bias of the first doped region 30 may, for example, be in the range of 0-3V. The bias of the second doped region 32 may, for example, be set to 12V. The bias of the gate electrode 24 may be set, for example, in a range of 12-15V in order to set the interface between the silicon oxide layer 22 and film 16 in an e− accumulation layer mode. In response to the application of the gate voltage, the h+ electrode voltage and the e− electrode voltage, an electric field E is formed within the semiconductor film layer 16 with field lines extending between the conductive gate 24 and the supporting semiconductor substrate 12 in a direction perpendicular to the front surface of the semiconductor film layer 16. Photon (hv) absorption occurs in the semiconductor film layer 16 at a depth dependent on photon wavelength and electron (e−) and hole (h+) generation results. The holes are drained to the h+ electrode and electrons are drained by the electric field to the interface between the silicon oxide layer 22 and film 16. Charge impact ionization occurs due to the electric field E extending across the semiconductor film layer 16 and an avalanche ensues. Electron and hole charge collection due to the avalanche multiplication is made, respectively, at the first and second doped regions and is passed out, respectively, through the e− and h+ electrodes.

It will be noted that the front side illuminated single photon avalanche gate photosensor device 10 differs from a convention single photon avalanche diode (SPAD) device because there is no P-N junction for the photosensing avalanche multiplication operation. This junctionless photosensing configuration advantageously does not suffer from the drawback of conventional SPAD devices where photosensing is associated with the P-N junction such as an undesirably high dark current rate due to junction defects and implanted silicon defects. Additionally, it will be noted that the front side illuminated single photon avalanche gate photosensor device 10 does not require the use of undesirably high operating voltages as is the case with conventional SPAD devices.

While the device 10 of FIG. 1A is shown with a p-doped semiconductor film layer 16 and operation in charge gate oxide accumulation mode, it will be understood that the dopant types for the various included structures could be exchanged so that an n-doped semiconductor film layer 16 is provide to instead operate in hole gate oxide accumulation mode. See, FIG. 1B. The operation of the device 10 configured in the foregoing manner would, for example, utilize, respectively, a biasing of the first doped region 30 through an e− electrode, a biasing of the second region 32 through an h+ electrode and finally a biasing of the gate electrode 24. The bias of the first doped region 30 may, for example, be in the range of 12 to 15V. The bias of the second doped region 32 may, for example, be set at 0V. The bias of the gate electrode 24 may be set, for example, in a range of −2 to 0V in order to set the interface between the silicon oxide layer 22 and film 16 in an h+ accumulation layer mode. In response to the application of the gate voltage, the h+ electrode voltage and the e− electrode voltage, an electric field E is formed within the semiconductor film layer 16 with field lines extending between the conductive gate 24 and the supporting semiconductor substrate 12 in a direction perpendicular to the front surface of the semiconductor film layer 16. Photon (hv) absorption occurs in the semiconductor film layer 16 at a depth dependent on photon wavelength and electron (e−) and hole (h+) generation results. The electrons are drained to the e− electrode and holes are drained by the electric field to the interface between the silicon oxide layer 22 and film 16. Charge impact ionization occurs due to the electric field E extending across the semiconductor film layer 16 and an avalanche ensues. Electron and hole charge collection due to the avalanche multiplication is made, respectively, at the first and second doped regions and is passed out, respectively, through the e− and h+ electrodes.

Figure 2A:
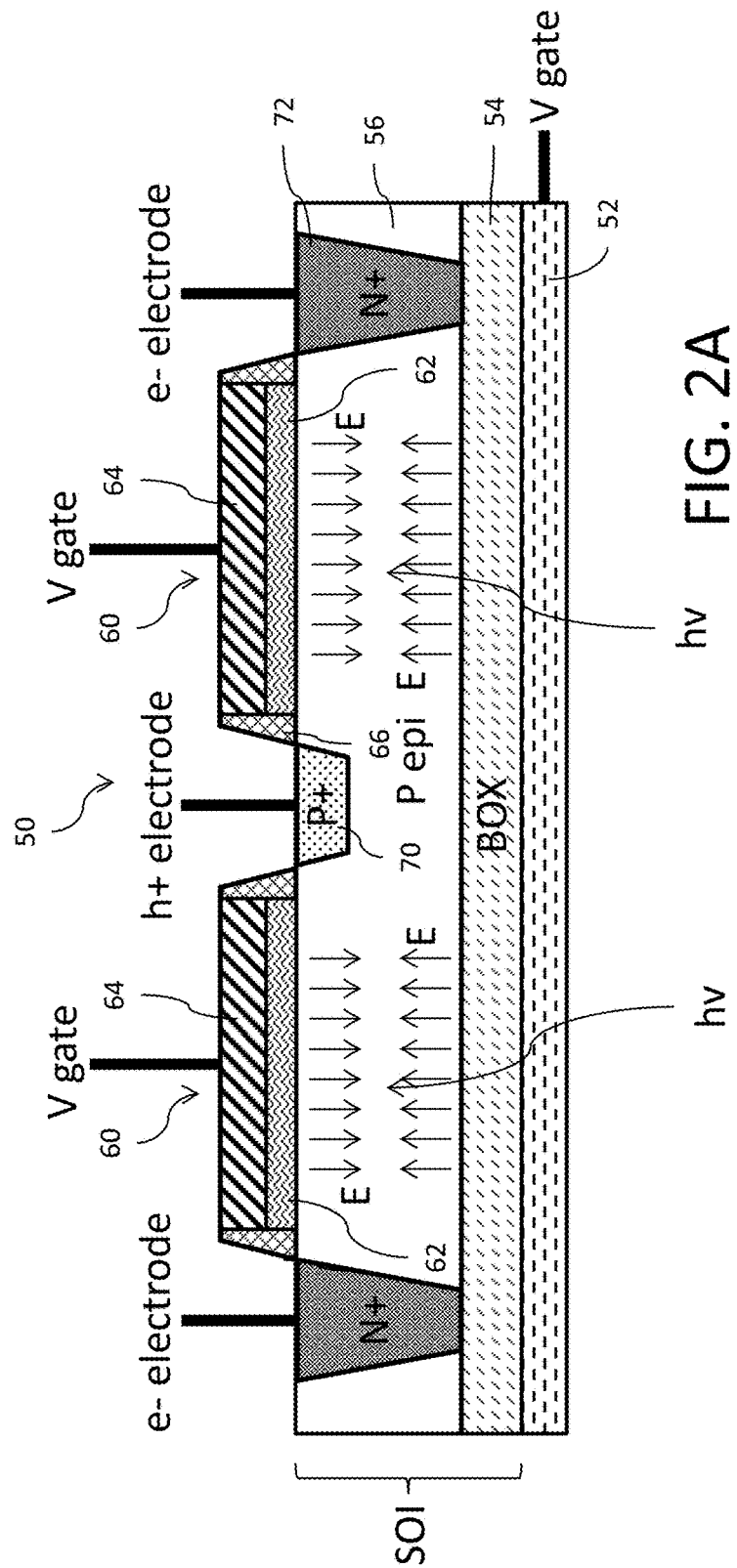
FIGS. 2A and 2B are cross-sectional diagrams of a back side illuminated single photon avalanche gate photosensor with a planar gate structure.

Reference is now made to FIG. 2A wherein there is shown a cross-sectional diagram of a back side illuminated single photon avalanche gate (SPAG) photosensor device 50. The device 50 is formed from a portion of a silicon on insulator (SOI) substrate comprising a buried insulating layer 54, also known to those skilled in the art as a buried oxide (BOX) layer and a semiconductor film layer 56 on top of the buried insulating layer 54. The underlying supporting semiconductor substrate of the SOI substrate has been removed and replaced with a conductive layer 52 at the back side that is transparent to the wavelength of the photon to be detected. The transparent conductive layer 52 may, for example, be made of an Indium-Tin-Oxide (ITO) material. The semiconductor film layer 56 is an epitaxially grown layer that is doped with a p-type dopant. The dopant concentration in the semiconductor film layer 56 may, for example, be in the range of $1\times10^{16}$ to $5\times10^{17}$ at/cm$^3$.

A planar insulated gate structure 60 is formed on the front surface of the semiconductor film layer 56. In an implementation, the semiconductor film layer 56 may include a gradient doping of $1\times10^{14}$ at the middle of layer 56 up to $5\times10^{17}$ at/cm$^3$ at the top of the layer 56 adjacent the interface between the layer 56 and the gate structure 60. The planar insulated gate structure 60 includes a gate dielectric layer 62, a conductive gate 64 and sidewall spacers 66. The gate dielectric layer 62 may, for example, be made of a silicon oxide material as is conventional in the fabrication of MOSFET devices. The conductive gate 64 may, for example, be made of a polysilicon and/or metal material as is conventional in the fabrication of MOSFET devices. The sidewall spacers 66 may, for example, be made of silicon oxide and/or silicon nitride materials as is conventional in the fabrication of MOSFET devices.

The planar insulated gate structure 60 may have a ring shape in plan view, where the ring surrounds a first doped region 70 that is formed in the semiconductor film layer 56 at the front surface. The first doped region 70 is heavily doped with the p-type dopant. The dopant concentration in the first doped region 70 may, for example, be in the range of $5\times10^{18}$ to $5\times10^{20}$ at/cm$^3$. The first doped region 70 has a thickness which is less than a thickness of the layer 56. On the opposite side of the ring-shaped planar insulated gate structure 60, and in a position surrounding the planar insulated gate structure 60, a ring-shaped second doped region 72 is formed in the semiconductor film layer 56 at the front surface. The second doped region 72 is heavily doped with an n-type dopant and is separated from the first doped region 70 by a part of the film layer 56 located under the ring-shaped planar insulated gate structure 60. The dopant concentration in the second doped region 72 may, for example, be in the range of $5\times10^{18}$ to $5\times10^{20}$ at/cm$^3$. The second doped region 72 has a thickness which extends completely through the thickness of the layer 56 to reach the interface with the buried oxide layer 54.

Operation of the back side illuminated single photon avalanche gate photosensor device 50 to detect a photon (hv) entering at the back side is the same as previously described for the front side illuminated single photon avalanche gate photosensor device 10 of FIG. 1A, and thus for sake of brevity will not be repeated.

Again, as previously described, the back side illuminated single photon avalanche gate photosensor device 50 differs from a convention single photon avalanche diode (SPAD) device because there is no P-N junction for the photosensing operation. This junctionless photosensing configuration advantageously does not suffer from the drawback of conventional SPAD devices where photosensing is associated with the P-N junction such as an undesirably high dark current rate due to junction defects and implanted silicon defects. Additionally, it will be noted that the back side illuminated single photon avalanche gate photosensor device 50 does not require the use of undesirably high operating voltages as is the case with conventional SPAD devices.

Figure 2B:
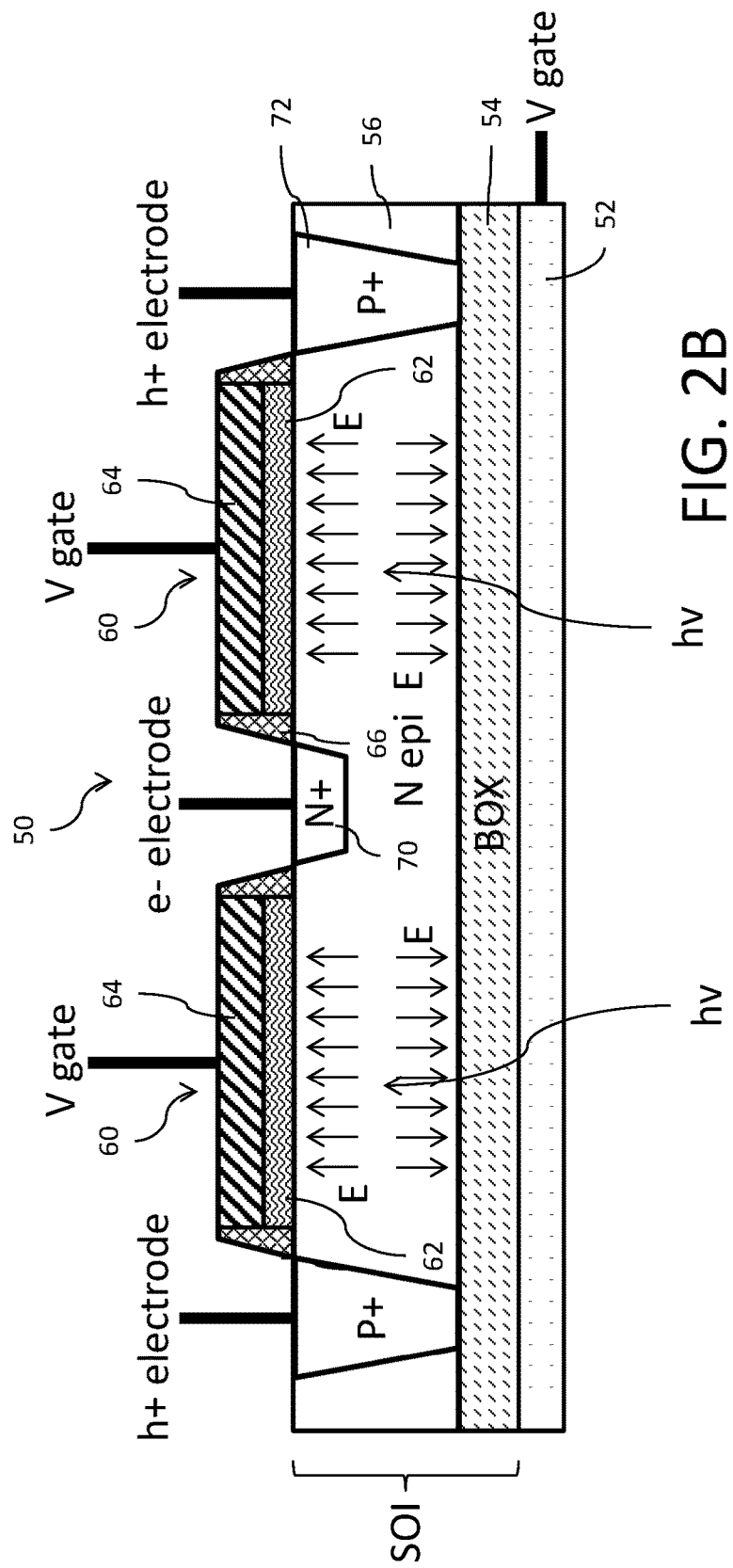

While the device 50 of FIG. 2A is shown with a p-doped semiconductor film layer 56 and operation in charge gate oxide accumulation mode, it will be understood that the dopant types for the various included structures could be exchanged so that an n-doped semiconductor film layer 56 is provide to instead operate in hole gate oxide accumulation mode. See, FIG. 2B.

Figure 1B:
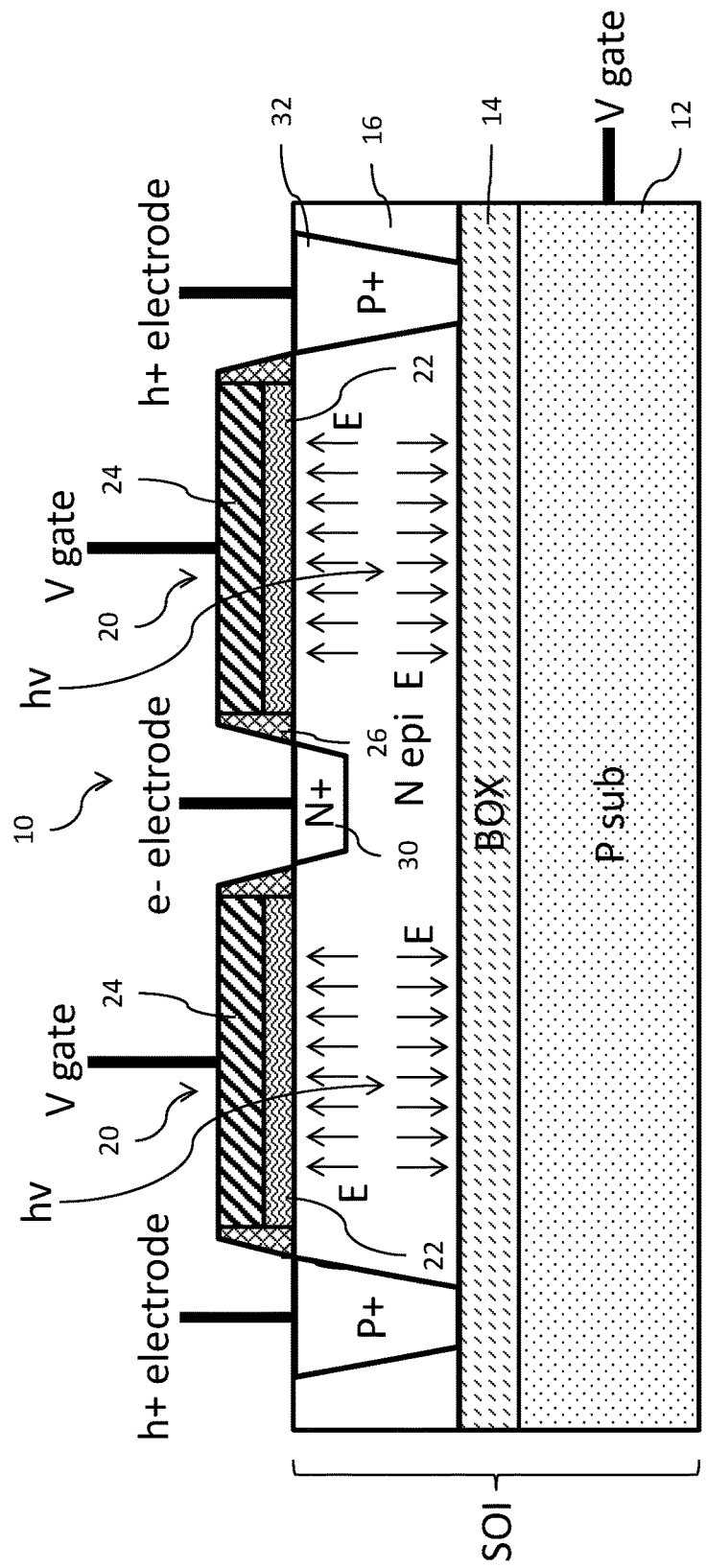

Operation of the back side illuminated single photon avalanche gate photosensor device 50 to detect a photon (hv) entering at the back side is the same as previously described for the front side illuminated single photon avalanche gate photosensor device 10 of FIG. 1B, and thus for sake of brevity will not be repeated.

Figure 3:
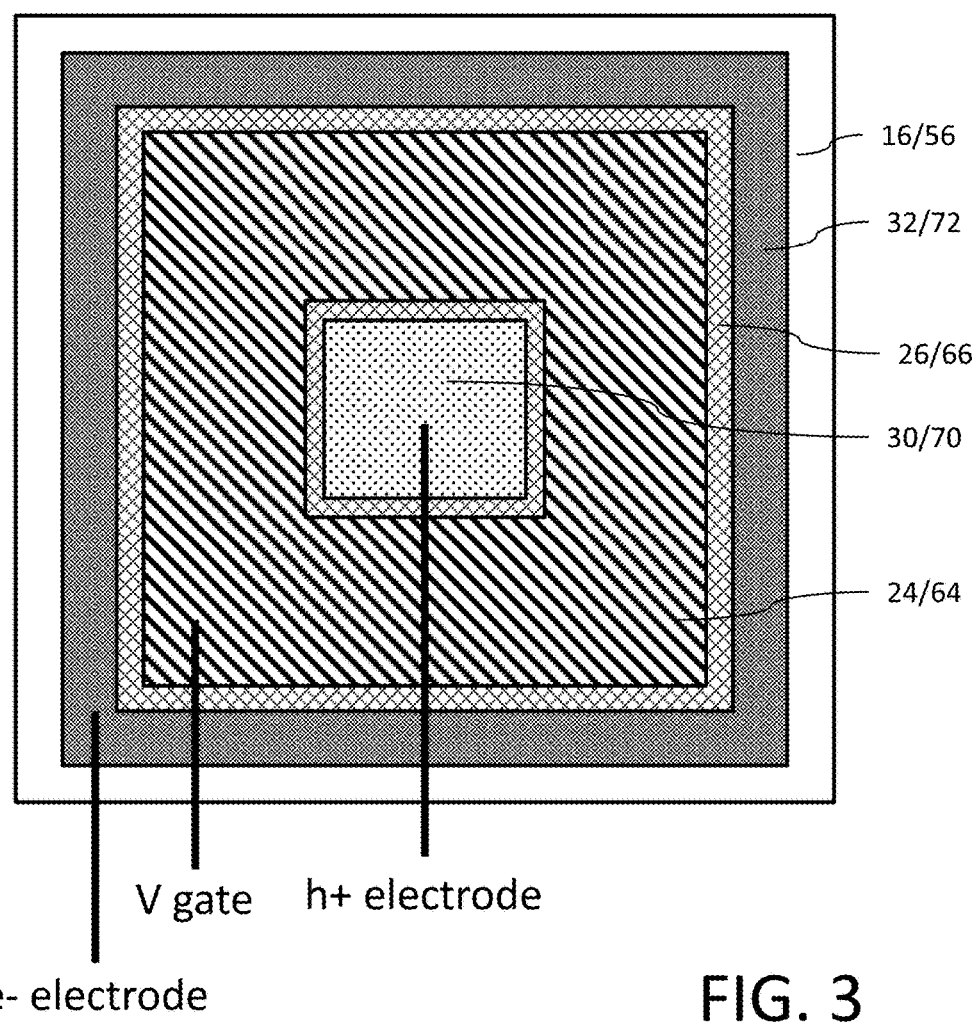
FIG. 3 shows a layout view of the photosensors of FIGS. 1A-1B and 2A-2B.

FIG. 3 shows a layout or plan view of the devices 10 and 50 as shown in FIGS. 1A and 2A. A similar plan layout, with the N and P dopants and electrodes switched, is applicable to the implementations of FIGS. 1B and 2B.

Figure 4A:
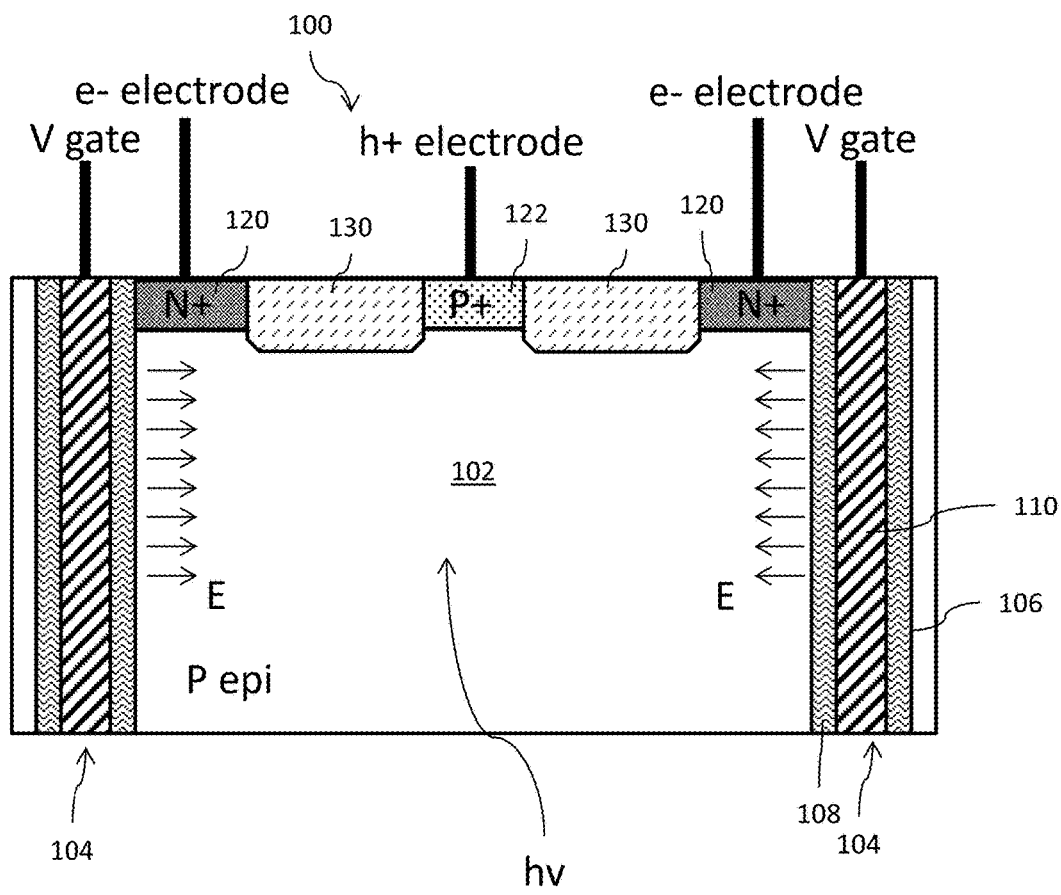
FIGS. 4A and 4B are cross-sectional diagrams of a back side illuminated single photon avalanche gate photosensor with a vertical gate structure.

Reference is now made to FIG. 4A which shows a cross-sectional diagram of a back side illuminated single photon avalanche gate photosensor 100. The device 100 is formed in a semiconductor substrate 102. The semiconductor substrate 102 may be an epitaxially grown layer that is doped with a p-type dopant. The dopant concentration in the semiconductor substrate 102 may, for example, be in the range of $1\times10^{16}$ to $5\times10^{17}$ at/cm$^3$. An active region of the substrate 102 for photon collection is delimited by a capacitive deep trench isolation (CDTI) structure 104 that forms a vertical gate electrode. The CDTI structure 104 is formed in a trench 106 that is lined by an insulating material 108 (such as a thermal oxide) and filled with a conductive material 110 (such as polysilicon). The CDTI structure 104 has a ring shape in plan view that surrounds the active region. In a preferred implementation, the CDTI structure 104 passes completely through a thickness of the semiconductor substrate 102 from the front surface to the back surface.

A first doped region 120 is formed in the semiconductor substrate 102 at the front surface. The first doped region 120 is heavily doped with the n-type dopant. The dopant concentration in the first doped region 120 may, for example, be in the range of $5\times10^{18}$ to $5\times10^{20}$ at/cm$^3$. A second doped region 122 is formed in the semiconductor substrate 102 at the front surface. The second doped region 122 is heavily doped with the p-type dopant. The dopant concentration in the second doped region 112 may, for example, be in the range of $5\times10^{18}$ to $5\times10^{20}$ at/cm$^3$. The first doped region 120 is separated from the second doped region 112 by a shallow trench isolation (STI) structure 130 formed in the semiconductor substrate 102 at the front surface. In a preferred embodiment, the STI structure 130 has a ring shape that surrounds the second doped region 122, with the second doped region 122 positioned at or near a center of the active region. The first doped region 120 is positioned at or near a periphery of the active region, for example, adjacent to the CDTI structure 104 and has a ring shape that surrounds the STI structure 130.

Operation of the back side illuminated single photon avalanche gate photosensor device 100 to detect a photon (hv) entering the back surface requires respectively biasing the second doped region 122 through an h+ electrode, the first doped region 120 through the e− electrode, and finally the gate electrode 110. The bias of the second doped region 122 may, for example, be in the range of 0-3V. The bias of the first doped region 120 may, for example, be set to 12V. The bias of the gate electrode 110 may be set, for example, in a range of 12-15V in order to set the interface between the layer 108 and semiconductor substrate 102 in an e− accumulation layer mode. In response to the application of the gate voltage, the h+ electrode voltage and the e− electrode voltage, an electric field E is formed within the semiconductor substrate 102 with field lines extending between the gate electrodes 110 in a parallel to the front surface of the semiconductor substrate 102. Photon (hv) absorption occurs in the semiconductor substrate 102 at a depth dependent on photon wavelength and electron (e−) and hole (h+) generation results. The holes are drained to the h+ electrode and electrons are drained by the electric field to the interface between the later 108 and the semiconductor substrate 102. Charge impact ionization occurs due to the electric field E extending across the semiconductor substrate 102 and an avalanche ensues. Electron and hole charge collection due to the avalanche multiplication is made, respectively, at the first and second doped regions and is passed out, respectively, through the e− and h+ electrodes.

It will be noted that the back side illuminated single photon avalanche gate photosensor device 100 differs from a convention single photon avalanche diode (SPAD) device because there is no P-N junction for the photosensing operation. This junctionless photosensing configuration advantageously does not suffer from the drawback of conventional SPAD devices where photosensing is associated with the P-N junction such as an undesirably high dark current rate due to junction defects and implanted silicon defects. Additionally, it will be noted that the back side illuminated single photon avalanche gate photosensor device 100 does not require the use of undesirably high operating voltages as is the case with conventional SPAD devices.

Figure 4B:
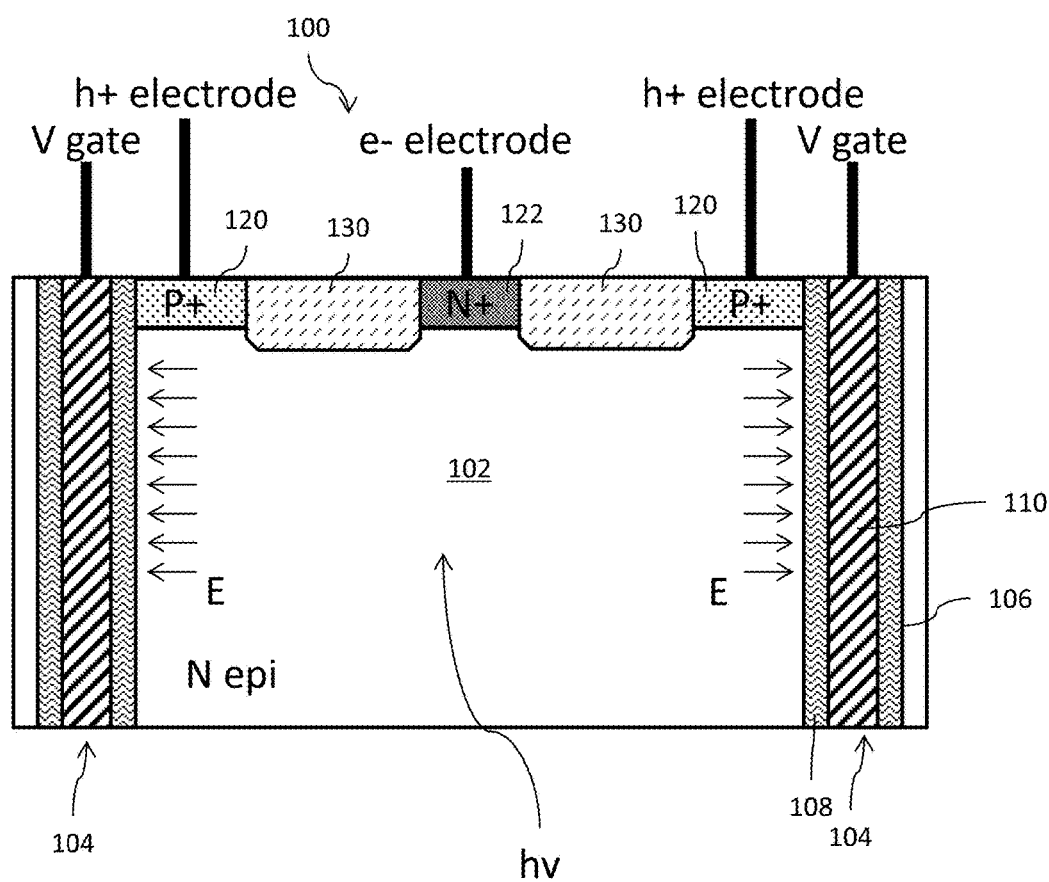

While the device 100 of FIG. 4A is shown with a p-doped semiconductor substrate 102 and operation in charge accumulation mode, it will be understood that the dopant types for the various included structures could be exchanged so that an n-doped semiconductor substrate 102 is provided to instead operate in hole accumulation mode. See, FIG. 4B. The operation of the device 100 configured as shown in FIG. 4B would, for example, utilize, respectively, a biasing of the second doped region 122 through an e− electrode, a biasing of the first region 120 through an h+ electrode and finally a biasing of the gate electrode 110. The bias of the second doped region 122 may, for example, be in the range of 12 to 15V. The bias of the first doped region 120 may, for example, be set at 0V. The bias of the gate electrode 110 may be set, for example, in a range of −2 to 0V in order to set the interface between the layer 108 and semiconductor substrate 102 in an h+ accumulation layer mode. In response to the application of the gate voltage, the h+ electrode voltage and the e− electrode voltage, an electric field E is formed within the semiconductor substrate 102 with field lines extending between the gate electrodes 110 in a direction parallel to the front surface of the semiconductor substrate 102. Photon (hv) absorption occurs in the semiconductor substrate 102 at a depth dependent on photon wavelength and electron (e−) and hole (h+) generation results. The electrons are drained to the e− electrode and holes are drained by the electric field to the interface between the layer 108 and substrate 102. Charge impact ionization occurs due to the electric field E extending across the semiconductor substrate 102 and an avalanche ensues. Electron and hole charge collection due to the avalanche multiplication is made, respectively, at the first and second doped regions and is passed out, respectively, through the e− and h+ electrodes.

Figure 5:
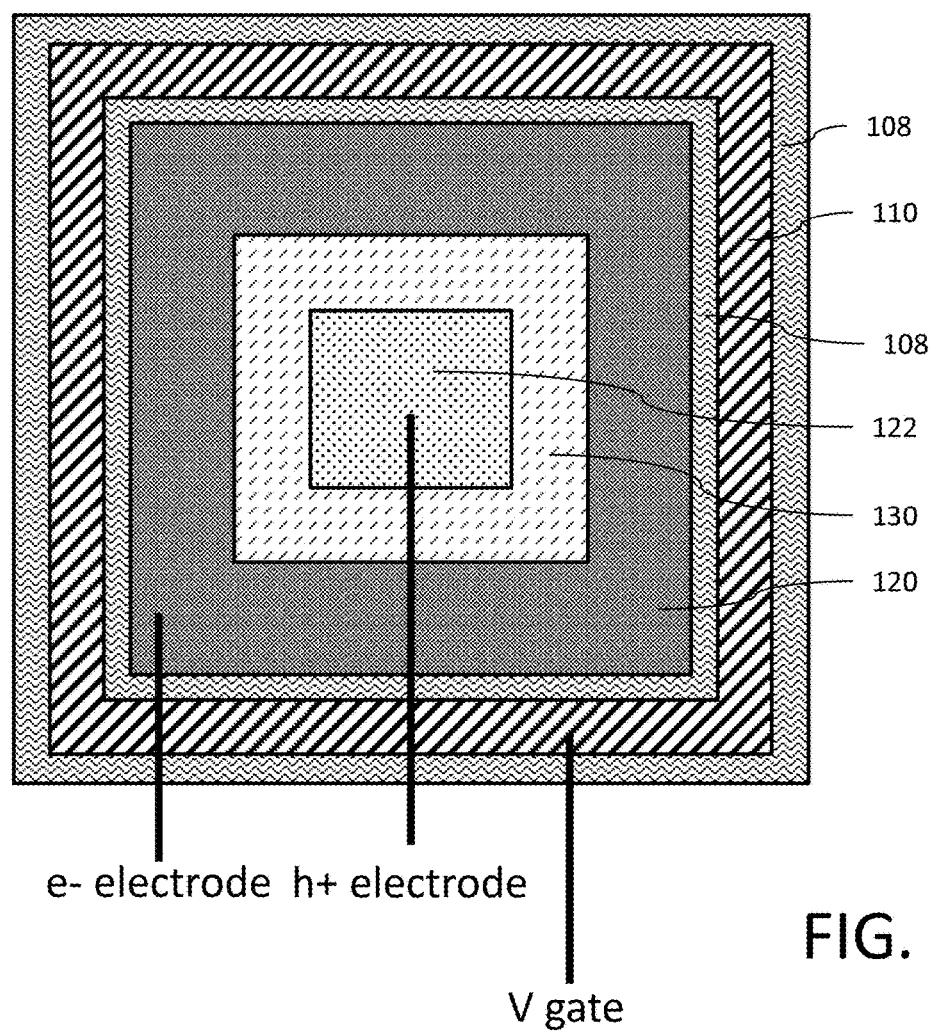
FIG. 5 shows a layout view of the photosensor of FIG. 4.

FIG. 5 shows a layout view of the back side illuminated single photon avalanche gate photosensor 100 as shown in FIG. 4A. A similar plan layout, with the N and P dopants switched, is applicable to the implementation of FIG. 4B.

Figure 6A:
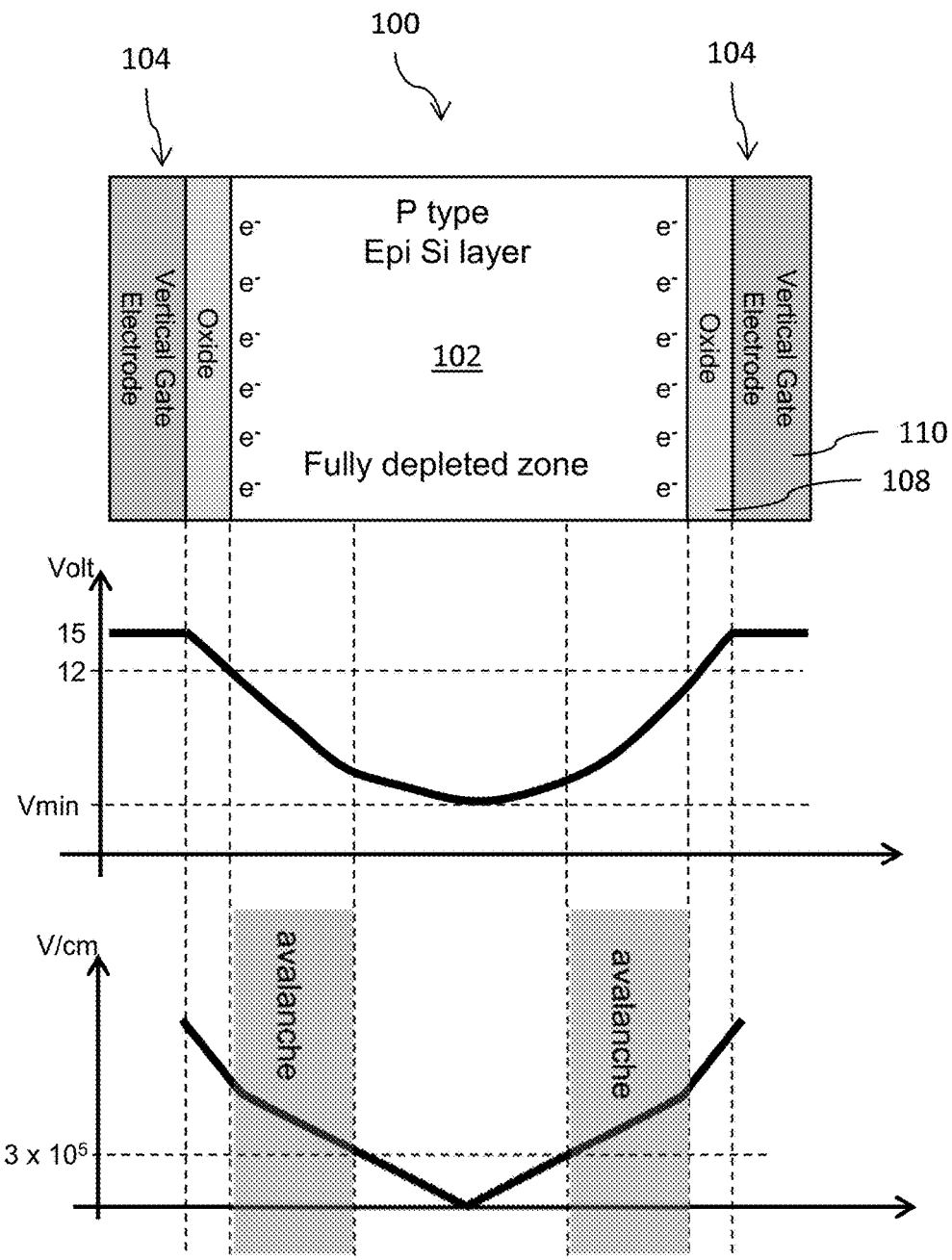
FIGS. 6A and 6B illustrate the operation principle of the photosensor of FIG. 4.
Figure 6B:
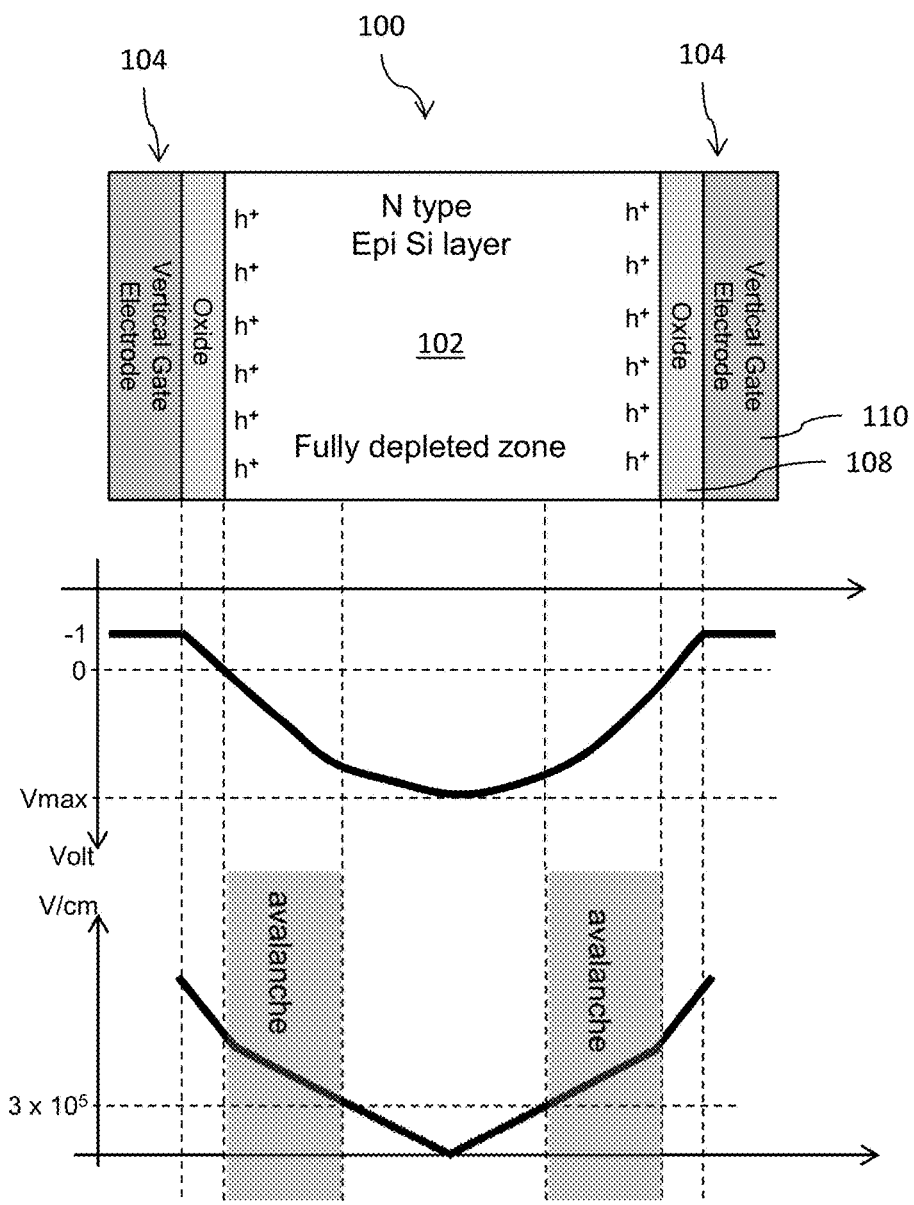

FIGS. 6A and 6B illustrate the basic principle of operation of the back side illuminated single photon avalanche gate photosensor 100, with FIG. 6A showing details for the semiconductor substrate 102 having an p-type doping (corresponding to FIG. 4A) and FIG. 6B showing details for the semiconductor substrate 102 having a n-type doping (corresponding to FIG. 4B).

Turning first to FIG. 6A, the upper portion of the figure shows a schematic cross-sectional view of the back side illuminated single photon avalanche gate photosensor 100 with the p-type doped semiconductor substrate 102 and the CDTI structures 104 shown with vertical gate electrodes (reference 110) insulated from the substrate 102 by an oxide layer (reference 108) and corresponding to FIG. 4A. The middle portion of the figure shows the variation in electrostatic potential laterally across the device from the positive gate voltage (15 V in this example) at the vertical gate electrodes of the CDTI structures 104 to the minimum voltage Vmin which corresponds to the electrostatic potential managed by the fully depleted doping profile. The positive gate voltage at the vertical gate electrodes of the CDTI structures 104 coupled with the e− electrode voltage (12V in this example) forces electron accumulation at the interface between layer 108 and substrate 102. The bias voltage applied to the h+ electrode drains holes out of the substrate 102 to create a fully depleted zone. During avalanche mode, holes migrate to the h+ electrode and electrons migrate to the e− electrode. The bottom portion of the figure further shows the regions where the avalanche effect occurs in response to absorption of a photon received through the back side and the presence of an electrostatic field strength in excess of the ionization impact critical field (for example, $3\times10^5$ V/cm).

The upper portion of FIG. 6B shows a schematic cross-sectional view of the back side illuminated single photon avalanche gate photosensor 100 with the n-type doped semiconductor substrate 102 and the CDTI structures 104 shown with vertical gate electrodes (reference 110) insulated from the substrate 102 by an oxide layer (reference 108) and corresponding to FIG. 4B. The middle portion of the figure shows the variation in electrostatic potential laterally across the device from the negative gate voltage (−1 V in this example) at the vertical gate electrodes of the CDTI structures 104 to the maximum voltage Vmax which corresponds to the electrostatic potential managed by the fully depleted doping profile. The negative gate voltage at the vertical gate electrodes of the CDTI structures 104 coupled with the h+ electrode voltage (0V in this example) forces hole accumulation at the interface between layer 108 and substrate 102. The bias voltage applied to the e− electrode drains carriers out of the substrate 102 to create a fully depleted zone. During avalanche mode, holes migrate to the h+ electrode and electrons migrate to the e− electrode. The bottom portion of the figure further shows the regions where the avalanche effect occurs in response to absorption of a photon received through the back side and the presence of an electrostatic field strength in excess of the ionization impact critical field (for example, $3\times10^5$ V/cm).

Figure 7:
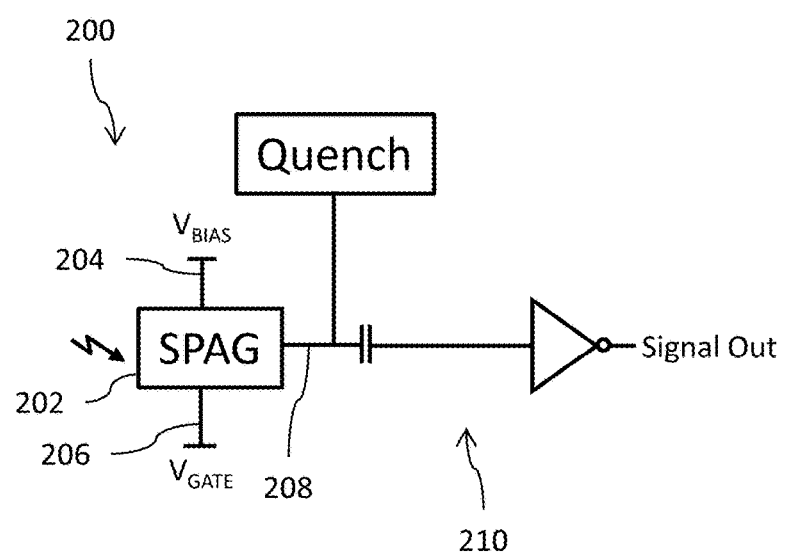
FIG. 7 is a circuit diagram of a sensing circuit using the single photon avalanche gate photosensor.

Reference is now made to FIG. 7 which shows a schematic diagram of a sensing circuit 200 which utilizes a single photon avalanche gate photosensor 202 of the type shown by the photosensors 10, 50 and 100 of FIGS. 1, 2 and 4, respectively. The h+ electrode is connected at node 204 to receive a bias voltage $V_{BIAS}$. The V gate is connected at node 206 to receive a gate voltage $V_{GATE}$. The e− signal electrode is connected at node 208 to output the sense signal to a read circuit 210. A quench circuit 212 is connected to the 208.

Alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A photosensor, comprising:
a semiconductor substrate doped with a first doping type;
an insulated gate electrode adjacent said semiconductor substrate;
a first region within the semiconductor substrate doped with the first doping type, wherein the first region is configured to be biased with a first bias voltage; and
a second region within the semiconductor substrate doped with a second doping type that is opposite the first doping type, wherein the second region is configured to be biased with a second bias voltage;
wherein the insulated gate electrode is configured to be biased by a gate voltage to produce an electrostatic field within the semiconductor substrate causing the formation of a fully depleted region within the semiconductor substrate, said fully depleted region responding to absorption of a photon with an avalanche multiplication that produces charges that are collected at the first and second regions.

2. The photosensor of claim 1, wherein biasing by the gate voltage causes accumulation of a first type of charge at an interface between the semiconductor substrate and the insulated gate electrode.

3. The photosensor of claim 2, wherein the first doping type is p-type, the second doping type is n-type, and the first type of charge is electrons.

4. The photosensor of claim 2, wherein the first doping type is p-type, the second doping type is n-type, and the collected charges from the avalanche multiplication for read out from the photosensor are electrons.

5. The photosensor of claim 2, wherein the first doping type is n-type, the second doping type is p-type, and the first type of charge is holes.

6. The photosensor of claim 2, wherein the first doping type is n-type, the second doping type is p-type, and the collected charges from the avalanche multiplication for read out from the photosensor are holes.

7. The photosensor of claim 2, wherein charges of the first type produced by the avalanche multiplication are collected at the second region.

8. The photosensor of claim 1, wherein the insulated gate electrode comprises a first gate electrode and a second gate electrode, wherein the semiconductor substrate is positioned between the first and second gate electrodes.

9. The photosensor of claim 8, wherein the semiconductor substrate has a front surface and wherein the first gate electrode extends parallel to the front surface.

10. The photosensor of claim 9, wherein the semiconductor substrate has a back surface and wherein the second gate electrode extends parallel to the back surface.

11. The photosensor of claim 10, wherein the semiconductor substrate is a semiconductor film of a silicon on insulator (SOI) substrate and the second gate electrode is formed by a semiconductor support layer of the SOI substrate that is insulated from the semiconductor film by an insulating layer.

12. The photosensor of claim 11, wherein the photon is received within the semiconductor substrate by passing through the front surface.

13. The photosensor of claim 9, wherein the semiconductor substrate is a semiconductor film and the second gate electrode is formed by a transparent metal layer that is insulated from the semiconductor film by an insulating layer.

14. The photosensor of claim 13, wherein the photon is received within the semiconductor substrate by passing through the transparent metal layer.

15. The photosensor of claim 13, wherein the transparent metal layer is made of Indium-Tin-Oxide.

16. The photosensor of claim 9, wherein the first and second regions are formed in the semiconductor substrate at the front surface.

17. The photosensor of claim 1, wherein the semiconductor substrate has a front surface and wherein the insulated gate electrode extends perpendicular to the front surface.

18. The photosensor of claim 17, wherein the insulated gate electrode is part of a capacitive deep trench isolation structure.

19. The photosensor of claim 18, wherein the capacitive deep trench isolation structure passes completely through a thickness of the semiconductor substrate from the front surface to a back surface.

20. The photosensor of claim 17, wherein the first and second regions are formed in the semiconductor substrate at the front surface.

21. The photosensor of claim 20, wherein the semiconductor substrate further includes a back surface extending parallel to the front surface, and wherein the photon is received within the semiconductor substrate by passing through the back surface.

22. The photosensor of claim 20, further comprising a shallow trench isolation structure surrounding the first region to insulate the first region from the second region.

23. The photosensor of claim 18, wherein the capacitive deep trench isolation structure has a ring shape surrounding an active region of the semiconductor substrate.

* * * * *